United States Patent
Ishikura (10) Patent No.: US 8,974,718 B2
(45) Date of Patent: Mar. 10, 2015

(54) METHOD FOR PRODUCING STRUCTURE AND METHOD FOR PRODUCING LIQUID DISCHARGE HEAD

(75) Inventor: Hiroe Ishikura, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 808 days.

(21) Appl. No.: 13/168,668

(22) Filed: Jun. 24, 2011

(65) Prior Publication Data
US 2011/0316188 A1 Dec. 29, 2011

(30) Foreign Application Priority Data
Jun. 28, 2010 (JP) .................................. 2010-146903

(51) Int. Cl.
*G03C 1/00* (2006.01)
*G03F 7/004* (2006.01)
*G03F 7/038* (2006.01)
*G03F 1/56* (2012.01)
*G03F 7/039* (2006.01)

(52) U.S. Cl.
CPC *G03F 7/038* (2013.01); *G03F 1/56* (2013.01); *G03F 7/039* (2013.01)
USPC .......................... 264/494; 430/338; 430/270.1

(58) Field of Classification Search
CPC ................... B29C 2035/0827; B29C 35/0805; B29C 35/08
USPC ........................................................ 264/494
See application file for complete search history.

(56) References Cited

U.S. PATENT DOCUMENTS

| 4,243,740 A | * | 1/1981 | Tsuda et al. | 430/270.1 |
| 4,705,729 A | * | 11/1987 | Sheats | 430/5 |
| 5,691,101 A | * | 11/1997 | Ushirogouchi et al. | 430/176 |
| 2009/0162797 A1 | * | 6/2009 | Tsuji et al. | 430/320 |

FOREIGN PATENT DOCUMENTS

| JP | 63-58367 B | 11/1988 |
| JP | 6-45242 B | 2/1994 |

OTHER PUBLICATIONS

Rameshbabu, K., et al., Facile one-pot synthesis of a photo patternable anthracene polymer, Tetrahedron Letters, vol. 48 (2007), pp. 4755-4760.*

* cited by examiner

*Primary Examiner* — Matthew Daniels
(74) *Attorney, Agent, or Firm* — Canon U.S.A, Inc. IP Division

(57) ABSTRACT

A method for producing a structure includes, in this order, providing a substrate composed of a first resin layer and a second resin layer laminated in this order, the first resin layer being made of a positive photosensitive resin having positive photosensitivity to light having a wavelength of 280 nm or more, and the second resin layer containing an anthracene compound, partially exposing the second resin layer to light having a wavelength of 300 nm or more, radiating light having a wavelength of 280 nm or more to the first resin layer through the exposed portions of the second resin layer using the unexposed portions of the second resin layer as a mask, thereby exposing the first resin layer to light, and removing the exposed portions of the first resin layer to form a structure.

6 Claims, 4 Drawing Sheets

METHOD FOR PRODUCING STRUCTURE AND METHOD FOR PRODUCING LIQUID DISCHARGE HEAD

BACKGROUND OF THE INVENTION

1. Field of the Invention

The present invention relates to a method for producing a structure including a photosensitive resin, and also to a method for producing a liquid discharge head using the method for producing the structure.

2. Description of the Related Art

With the recent development of science technology, requirements for the techniques in forming fine structures are increasing in various fields. Dedicated researches are carried out in the fields of microactuators, electronic devices, and optical devices. For example, studies on various small sensors, microprobes, thin film magnetic heads, and inkjet heads are advancing. The fine structures are made by various methods, such as stamper, dry etching, or photolithography. In particular, pattern formation by photolithography using photosensitive resin materials provides satisfactory forms having high aspect ratios with high precision and easiness.

Japanese Patent Publication No. 6-45242 discusses a method for producing an inkjet head composed of a structure using photolithography. According to the method, an inkjet head is made by the method including the following processes. Firstly, on a substrate having energy generating elements thereon, an ink flow path pattern is formed using a removable resin by photolithographic technique. Secondly, a coating resin layer to be an ink flow path wall, which contains an epoxy resin and a photocationic polymerization initiator, is formed on the ink flow path pattern, and discharge ports are formed on the energy generating elements by photolithography. Subsequently, the removable resin is dissolved, and the coating resin layer to be an ink flow path wall is cured.

However, in this method, the accuracy of alignment between the substrate and photolithographic mask may be insufficient for the formation of the pattern to be the mold of flow paths. In particular, when a large wafer of about 8 to 12 inch is exposed to light, the accuracy of alignment within or between substrates may be varied by the influences of warpage of the substrate and deflection of the mask.

When a positive photosensitive resin of main chain decomposing type is used to form the flow path pattern, the resin usually has low sensitivity, and thus requires radiation of a large amount of light for achieving sufficient decomposition reaction. As a result, heat generated during exposure may cause nonuniform thermal expansion in the mask and substrate, which results in poor resolution and alignment accuracy.

Japanese Patent Publication No. 63-58367 discusses a method of pattern formation using a two-layer photosensitive resin, the method achieving improved resolution and alignment accuracy in the above-described photolithography. According to the method, a lower layer is formed using a photosensitive resin, and an upper layer is formed thereon using a material which shields light having a wavelength to which the lower layer is sensitive. Thereafter, the upper layer is patterned through exposure and development to make a mask, and the mask is used to pattern the photosensitive resin of the lower layer. The method is widely used for a pattern having high resolution and high precision.

According to the method described in Japanese Patent Publication No. 63-58367, the upper layer is subjected to exposure and development to form a mask. Therefore, the method includes many processes, and can increase loads on the production.

SUMMARY OF THE INVENTION

The present invention is directed to a fine structure formed with high precision and produced in a high yield by a simple production process.

According to an aspect of the present invention, there is provided a method for producing a structure including, in this order: providing a substrate composed of a first resin layer and a second resin layer laminated in this order, the first resin layer being made of a positive photosensitive resin having positive photosensitivity to light having a wavelength of 280 nm or more, and the second resin layer containing an anthracene compound; partially exposing the second resin layer to light having a wavelength of 300 nm or more; radiating light having a wavelength of 280 nm or more to the first resin layer through the exposed portions of the second resin layer using the unexposed portions of the second resin layer as a mask, thereby exposing the first resin layer to light; and removing the exposed portions of the first resin layer to form a structure.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DESCRIPTION OF THE EMBODIMENTS

Various exemplary embodiments, features, and aspects of the invention will be described in detail below with reference to the drawings.

FIG. 1 is a schematic cross sectional view for illustrating a method for producing a structure according to an exemplary embodiment 1 of the present invention. Firstly, as illustrated in FIG. 1A, a substrate 101 is provided. The substrate is not particularly limited as to its shape or material, as long as it works as a support of the fine structure to be formed. The substrate may be, for example, a silicon substrate. Secondly, as illustrated in FIG. 1B, a first resin layer 102 made of a photosensitive resin and a second resin layer 103 containing an anthracene compound are formed on the substrate 101.

Figure 1A:
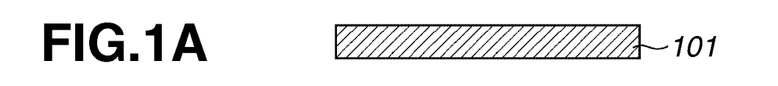
FIGS. 1A to 1F are schematic cross sectional views for illustrating a method for producing a structure according to an exemplary embodiment of the present invention.
Figure 1B:
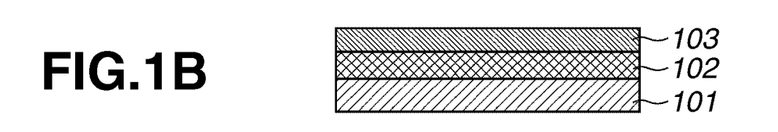

The photosensitive resin used to make the first resin layer 102 may be a positive photosensitive resin having positive photosensitivity to light having a wavelength of 280 nm or more, or a positive photosensitive resin having positive photosensitivity to light having a wavelength of 240 nm or less. Alternatively, a negative photosensitive resin having negative photosensitivity to light having a wavelength of 280 nm or more, or a negative photosensitive resin having negative photosensitivity to light having a wavelength of 240 nm or less may be used.

Examples of the positive photosensitive resin include polymethyl isopropenyl ketone and polymeric photosensitive resins of main chain decomposing type composed mainly of methacrylate ester. Examples of the polymeric positive photosensitive resin of main chain decomposing type composed mainly of methacrylate include homopolymers such as polymethyl methacrylate and polyethyl methacrylate. Other examples include copolymers of methyl methacrylate and methacrylic acid, acrylic acid, glycidyl methacrylate, or phenyl methacrylate.

The polymeric positive photosensitive resins of main chain decomposing type composed mainly of methacrylate ester are typically sensitive to light of a wavelength from 200 to 240 nm. Polymethyl isopropenyl ketone has positive photosensitivity to light of wavelengths from 260 nm to 320 nm. The negative photosensitive resin having negative photosensitivity to light of a wavelength of 280 nm or more may be those containing an epoxy resin and an aromatic sulfonium salt.

An example of the anthracene compound contained in the second resin layer 103 has the structure represented by the formula (1):

[Chemical Formula 1]

(1)

wherein $R^1$ to $R^8$ each independently represent hydrogen, an alkyl group, an alkoxy group, an alkenyl group, an ethynyl group, an aryl group, an acyl group having 1 to 20 carbon atoms, or a substituted organic group derived from any of the groups; $R^9$ and $R^{19}$ represent an alkoxy group having 1 to 20 carbon atoms, or an organic group substituted with other substituent.

Other examples include anthracene compounds and derivatives thereof which can be dimerized to show the below-described wavelength change.

The second resin layer 103 may contain a resin (hereinafter referred to as a base resin) besides the above-described anthracene compound. The base resin is used to immobilize the anthracene compound thereby forming a layer. The material of the base resin is required to transmit light having a wavelength used to expose the first photosensitive resin layer. According to aspects of the present invention, the first resin layer 102 can be exposed to light without development and patterning of the second resin layer 103. The base resin may absorb no light used to expose the first resin layer 102, but may slightly absorb the light. For example, the base resin can transmit 10% or more of the light having a wavelength to which the photosensitive resin used to form the first resin layer 102 is sensitive. In addition, from the viewpoint of alignment accuracy, the second resin layer 103 can be exposed to light using a stepper, and can be patterned with a most widely used i-line (365 nm).

Figure 1C:
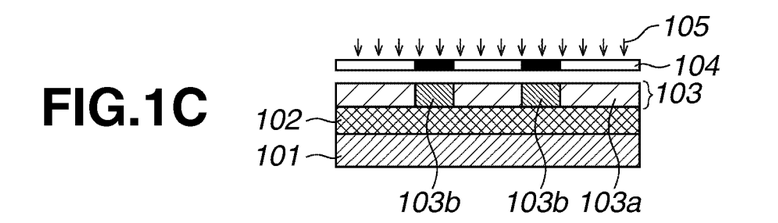

Subsequently, as illustrated in FIG. 1C, light 105 having a wavelength of 300 nm or more is radiated to a second layer 103 through a mask 104, thereby partially changing the absorption wavelength in the second layer 103. More specifically, the absorption wavelength of the exposed portions 103a is changed. The irradiation light contains light having a wavelength of 300 nm or more, and does not have to consist exclusively of light having a wavelength of 300 nm. Anthracene compounds are known to be dimerized upon irradiation with light having a wavelength of 300 nm or more. As an example, dimerization of 9,10-dialkoxyanthracene is illustrated below.

[Chemical formula 2]

The absorption spectrum of a monomeric anthracene compound extends from about 280 nm, has a strong absorption in the range from about 320 nm to 400 nm, and has a maximum absorption near 380 nm. The compound also absorbs light from 240 nm to 260 nm. On the other hand, the absorption is relatively weak in the range from about 260 nm to 280 nm, and from about 220 nm to 240 nm, indicating a certain degree of transparency. The dimer formed by dimerization reaction upon photoirradiation shows a decreased absorption and increased transmittance in the range from about 280 nm to 400 nm. In addition, the dimer shows an increased absorbance at 240 nm or less.

As a result, the exposed portions 103a easily transmit light having a wavelength of 280 nm or more, and have an improved ability to shield light having a wavelength of 240 nm or less. On the other hand, unexposed portions 103b absorb light having a wavelength from 280 nm to 400 nm, and light having a wavelength from 240 nm to 260 nm. The second resin layer 103 can contain 1% by weight or more and 20% by weight or less of an anthracene compound with reference to the solid content of the second resin layer 103. The content is not limited to this range as long as light shielding performance is achieved, and can be adjusted according to the absorbance of the first photosensitive resin.

Figure 1D:
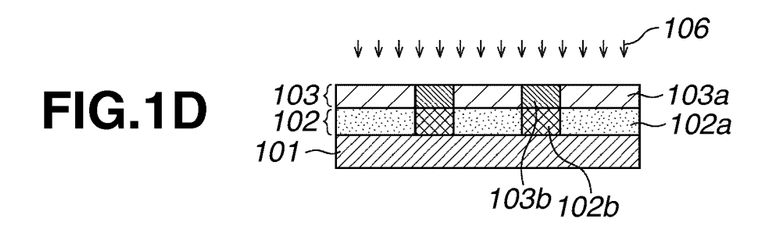

Subsequently, as illustrated in FIG. 1D, the first resin layer 102 is entirely exposed to light 106 having a wavelength to which the first resin layer 102 is sensitive, through the second resin layer 103 having a latent image formed thereon.

For example, a positive photosensitive resin having positive photosensitivity to light having a wavelength of 280 nm or more is used to form the first resin layer 102. Using the unexposed portions 103b of the second resin layer 103 as a mask, light having a wavelength of 280 nm or more is radiated to the first resin layer 102 through the exposed portions 103a on the second resin layer 103. The exposed portions 103a of the second resin layer 103 transmits light having a wavelength of 280 nm or more, so that the regions located below the exposed portions 103a of the second resin layer 103 are exposed to light, and exposed portions 102a are formed on the first layer 102. At this time, monomers of the anthracene compound in the unexposed portions 103b of the second resin layer 103 absorb light having a wavelength of 280 nm or more and 400 nm or less, so that the regions of the first resin layer 102 located below the unexposed portions 103b of the second resin layer 103 are shielded from light, and become unexposed portions 102b. The irradiation light contains light having a wavelength of 280 nm or more, and does not have to consist exclusively of light having a wavelength of 280 nm.

During exposure of the first resin layer 102 using the unexposed portions 103b of the second resin layer 103 as a mask, dimerization reaction during exposure of the anthracene compound in the unexposed portions 103b can be inhibited. This is achieved by, for example, exposure using a bandpass filter. Although depending on the resin in the first resin layer, for example, it is useful to use a bandpass filter which can cut light having a wavelength of 320 nm or more, and it is more useful to use a bandpass filter which can cut light having a wavelength of 310 nm or more. And it is even more useful to use a bandpass filter which can cut light having a wavelength of 300 nm or more.

Dimers of anthracene compounds favorably transmit light having a wavelength of 300 nm or more. Therefore, it is more useful that a resin having positive photosensitivity to light having a wavelength of 300 nm or more is used to form the first resin layer 102, and that light having a wavelength of 300 nm or more is radiated to the first resin layer 102 through the exposed portions 103a of the second resin layer 103.

Figure 1E:
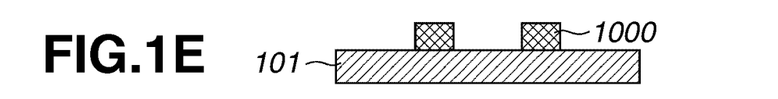

Subsequently, the first resin layer 102 is partially removed. In the following case, a resin showing positive photosensitivity to light having a wavelength of 280 nm or more is used to form the first resin layer 102, and light having a wavelength of 280 nm or more is radiated to the first resin layer 102 through the exposed portions 103a of the second resin layer 103, using the unexposed portions 103b as a mask. In this case, the exposed portions 102a of the first resin layer 102 are converted into positive. Accordingly, as illustrated in FIG. 1E, the first resin layer 102 is developed, the exposed portions 102a are removed, thus obtaining a structure 1000. The removal of the second resin layer 103 is easy, because polymerization reaction does not progress in the second resin layer 103 although dimerization reaction progresses. Accordingly, as illustrated in FIG. 1E, when a resin soluble in a developing solution for the first resin layer 102 is used to form the second resin layer, the second resin layer 103 can be removed during development process of the first resin layer 102. Alternatively, the first resin layer 102 may be removed after removal of the second resin layer 103.

A structure whose alignment is controlled with high precision can be formed by undergoing the above-described processes.

Figure 1F:
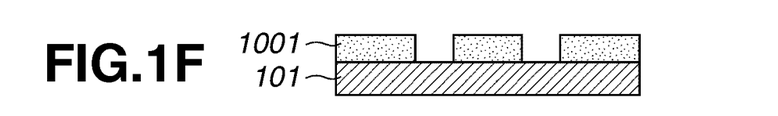

Alternatively, when a negative photosensitive resin having negative photosensitivity to light having a wavelength of 280 nm or more is used to form the first resin layer 102 in place of the resin having positive photosensitivity to light having a wavelength of 280 nm or more, the exposed portions 102a of the first resin layer 102 are cured. When the first layer 102 is developed, the unexposed portions 102b are removed, and a structure 1001 composed of the cured exposed portions 102a is obtained.

A known coating method such as spin coating, roll coating, or slit coating may be used for formation of the first resin layer 102 and the second resin layer 103. Alternatively, a dry film of a positive photosensitive resin may be laminated. The first resin layer 102 may contain additives such as a light absorbent, thereby preventing reflection from the substrate surface.

Figure 4A:
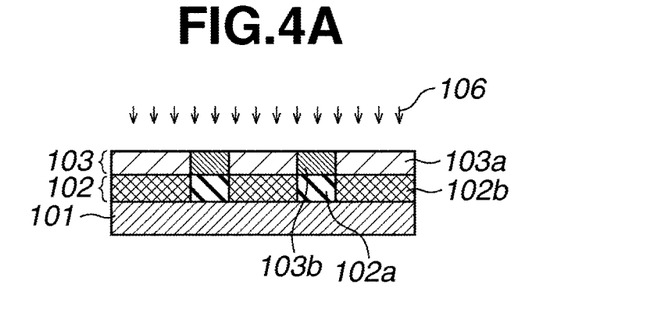
FIGS. 4A to 4C are schematic cross sectional views for illustrating the method for producing a liquid discharge head according to an exemplary embodiment of the present invention.
Figure 4B:
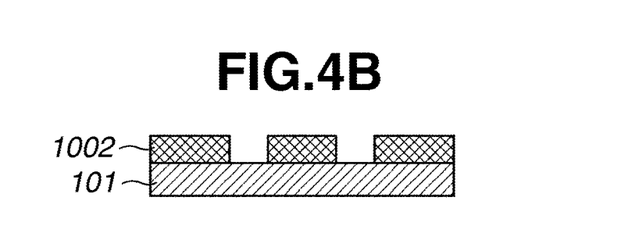

Another case is described. In the case, a resin having positive photosensitivity to light having a wavelength of 240 nm or less is used to form the first resin layer 102, and light having a wavelength of 240 nm or less is radiated to the first resin layer 102 through the second resin layer 103. In this case, as illustrated in FIG. 4A, the exposed portions 103a of the second resin layer 103 shield light having a wavelength of 240 nm or less, so that the regions of the first resin layer located below the exposed portions 103a become the unexposed portions 102b. On the other hand, the unexposed portions 103b of the second resin layer 103 transmit light having a wavelength of 240 nm or less, so that the regions of the first resin layer located below the exposed portions 103a become the exposed portions 102a. The exposed portions 102a are removed by development, and a structure 1002 is obtained as illustrated in FIG. 4B.

Figure 4C:
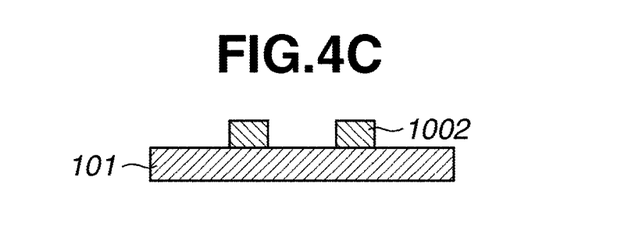

Alternatively, a negative photosensitive resin having negative photosensitivity to light having a wavelength of 240 nm or less may be used to form the first resin layer 102, and light having a wavelength of 240 nm or less can be radiated to the first resin layer 102 through the second resin layer 103. In this case, the exposed portions 102a illustrated in FIG. 4A are cured, and the unexposed portions 102b are removed, and thus the cured portions 102a form a structure 1002 as illustrated in FIG. 4C.

As described above, the second resin layer 103 can be used without development as a mask through which the first resin layer 102 is exposed to light. As a result, development process can be reduced compared with a prior art. In addition, since the second resin layer 103 does not require development, the material of the first resin layer 102 located below the second resin layer 103 can be selected from a wider range of choices.

A method for producing a liquid discharge head represented by an inkjet recording head according to an exemplary embodiment the present invention will be described. The liquid discharge head may be used as an inkjet recording head and for other purposes such as production of electron circuits and color filters.

Figure 3:
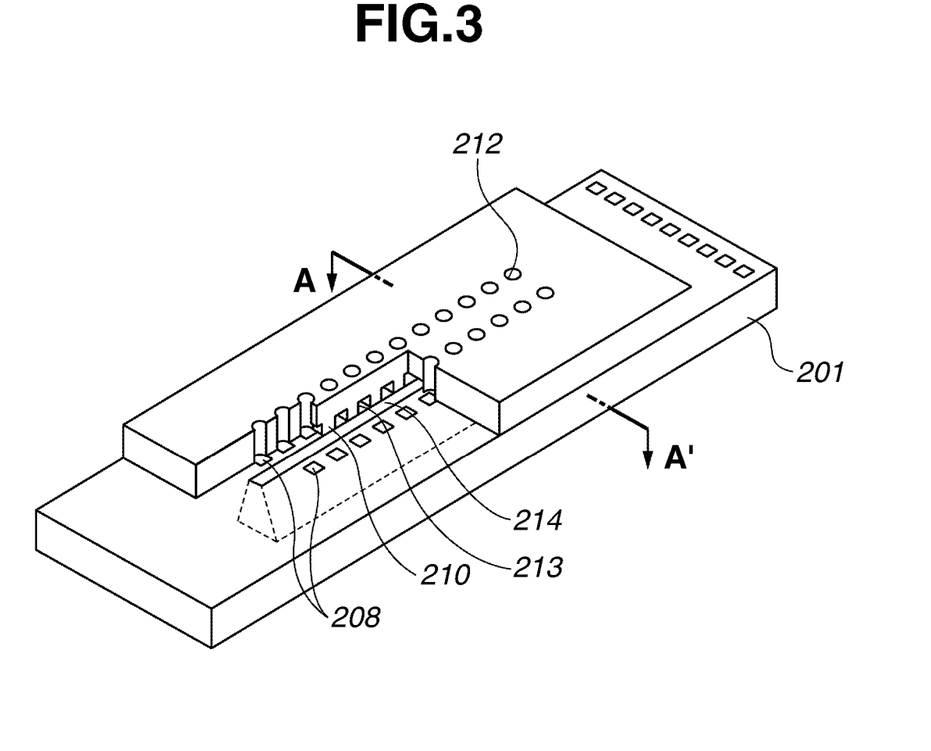
FIG. 3 is a schematic view for illustrating a liquid discharge head obtained by the method for producing a liquid discharge head according to an exemplary embodiment of the present invention.

FIG. 3 is a perspective view of the liquid discharge head obtained by the method for producing a liquid discharge head according to an exemplary embodiment of the present invention.

The liquid discharge head includes a substrate 201 made of silicon or the like, and a flow path wall member 210 provided thereon. The flow path wall member 210 has discharge ports 212 for discharging droplets, and liquid flow paths 213 communicated with the discharge ports 212. Discharge energy generating elements 208 are formed within the liquid flow paths 213 on the substrate 1, and droplets are discharged by the energy generated by the discharge energy generating elements 208. In addition, the substrate 1 has supply ports 214 for supplying a liquid to the liquid flow paths 213.

Figure 2A:
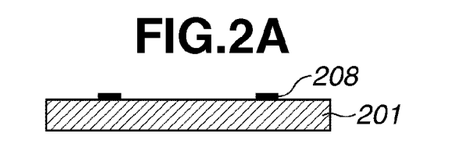
FIGS. 2A to 2K are schematic cross sectional views for illustrating a method for producing a liquid discharge head according to an exemplary embodiment of the present invention.

Firstly, as illustrated in FIG. 2A, the substrate 201 having the energy generating elements 208 are provided.

Figure 2B:
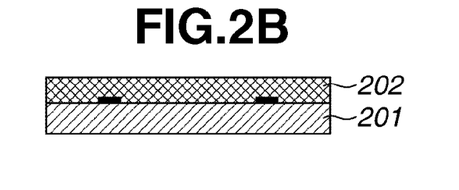

Secondly, as illustrated in FIG. 2B, a first resin layer 202 made of a positive photosensitive resin layer is formed on the substrate 201 having the energy generating elements 208.

As described above, the positive photosensitive resin layer may be, for example, polymethyl isopropenyl ketone or a polymeric photosensitive resin of main chain decomposing type composed mainly of methacrylate ester. An example wherein a positive photosensitive resin having positive photosensitivity to light having a wavelength of 280 nm or more is used to form the first resin layer 102 will be described.

Figure 2C:
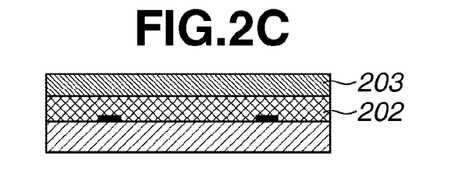

Subsequently, as illustrated in FIG. 2C, a second resin layer 203 containing an anthracene compound is formed on the first resin layer 202.

Figure 2D:
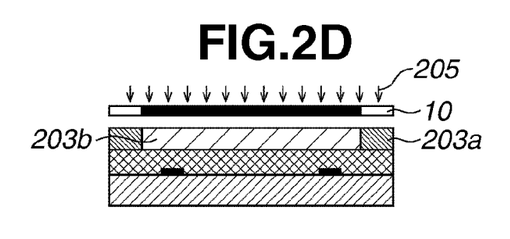

Subsequently, as illustrated in FIG. 2D, light 205 having a wavelength of 300 nm or more is radiated to the second resin layer 203 using a mask 10, thereby forming exposed portions 203a. Dimerization of the anthracene compound proceeds in the exposed portions 203a of the second resin layer 203. The anthracene compound and bisanthracene compound produced by the dimerization reaction will not generate basic substances, whereby the contamination of the production line is prevented. In addition, the reaction will not be inhibited during the subsequent curing reaction using an acid.

Figure 2E:
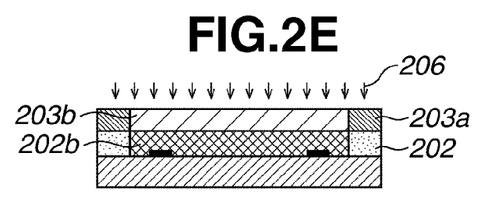

Subsequently, as illustrated in FIG. 2E, light having a wavelength of 280 nm or more is radiated to the first resin layer 202 through the exposed portions 203a, using the unexposed portions 203b as a mask.

Figure 2F:
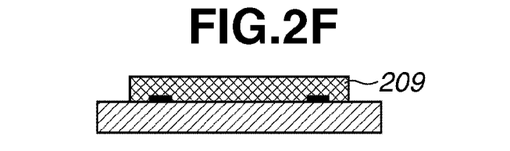

Subsequently, as illustrated in FIG. 2F, the second resin layer 203 is removed, and the first resin layer 202 is developed, thereby forming a flow path pattern 209 to be the mold of flow paths from the unexposed portions 202b of the first resin layer.

Figure 2G:
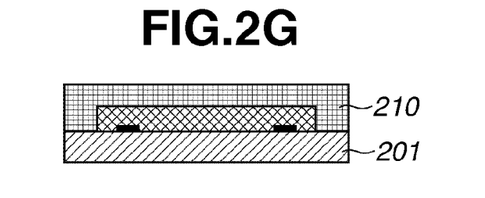

Subsequently, as illustrated in FIG. 2G, a coating layer 210 to be a flow path wall member is formed by, for example, spin coating, roll coating, or slit coating to coat the flow path pattern 209.

The coating layer 210 works as a member composing the ink flow paths and ink discharge ports, and thus is required to have high mechanical strength, adhesiveness to the base, ink resistance, and resolution for forming a fine pattern of ink discharge ports. In view of materials which satisfy the properties, epoxy resin compositions of cationic polymerization type can be used.

Examples of the epoxy resin include reactants between bisphenol A and epichlorohydrin, specifically those having a molecular weight of about 900 or more, and reactants between bromobisphenol A and epichlorohydrin. However, the epoxy resin is not limited to above described compounds.

It can be useful when a compound having an epoxy equivalent weight of 2000 or less is used as the epoxy resin. And it can be more useful when a compound having an epoxy equivalent weight of 1000 or less is used. When the epoxy equivalent weight is 2000 or less, the crosslinking density becomes within an adequate range by curing reaction, and good adhesion and ink resistance can be achieved.

The photocationic polymerization initiator for curing the epoxy resin may be a photoacid generating agent which generates an acid upon photoirradiation. The photoacid generating agent is not particularly limited, and may be, for example, an aromatic sulfonium salt or an aromatic iodonium salt. As necessary, an ink repellent layer (not illustrated) having negative photosensitivity may be formed on the coating layer 210.

Figure 2H:
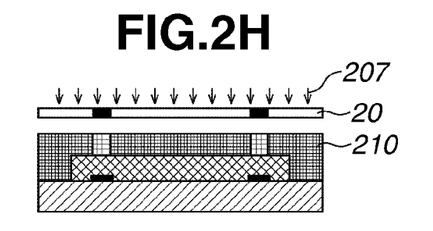

Subsequently, as illustrated in FIG. 2H, light 207 is irradiated to the coating layer 210 using, for example, an i-line stepper through a mask 20, thereby exposing the coating layer 210 to light for forming discharge ports.

Figure 2I:
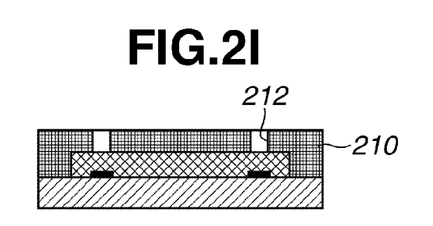

Subsequently, as illustrated in FIG. 2I, discharge ports 212 are formed by development processing. At this time concurrently with the development, the ink flow path pattern made of a positive photosensitive resin may be dissolved and removed.

Figure 2J:
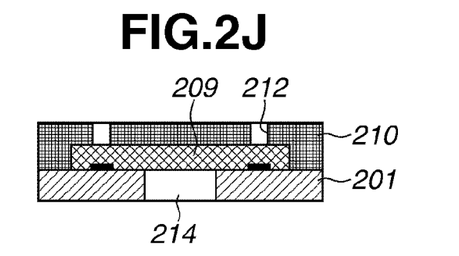
Figure 2K:
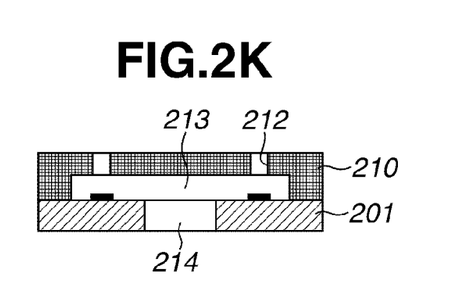

Subsequently, as illustrated in FIG. 2J, the supply ports 214, which penetrates the substrate 201, are formed. Subsequently, as illustrated in FIG. 2K, as necessary, light is radiated to the top surface of the flow path forming member, and the flow path pattern 209 is dissolved and removed, thereby forming the flow paths 213.

Thereafter, after a cutting process (not illustrated), as necessary, the flow path forming member is further cured by heat treatment. Subsequently, a member (not illustrated) for supplying a liquid such as ink is connected and electrically bonded (not illustrated) thereby driving the energy generating elements, and thus making a liquid discharge head.

The present invention is further described below with reference to exemplary embodiments.

As a first exemplary embodiment, an inkjet head was made according to the processes illustrated in FIGS. 2A to 2K. Firstly, as illustrated in FIG. 2A, a substrate 201 was provided. In the exemplary embodiment, an 8-inch silicon substrate was provided. The silicon substrate has electrothermal converting elements (heaters made of TaSiN) as energy generating elements.

Subsequently, as illustrated in FIG. 2B, a positive photosensitive resin was formed as a first resin layer 202 on the substrate 201. Specifically, polymethyl isopropenyl ketone was applied to the substrate 201 by spin coating, baked at 120° C. for 6 minutes, thereby forming the first resin layer 202. The thickness of the first resin layer after baking was 15 μm.

Subsequently, as illustrated in FIG. 2C, the following compositions were laminated as a second resin layer 203 in a thickness of 4 μm on the first resin layer 202.

Resin: AV LIGHT EP4050G (manufactured by Asahi Organic Chemicals Industry Co., Ltd.) 40 parts by mass Anthracene compound: 9,10-diethoxyanthracene 2 parts by mass Solvent: 2-heptanone 60 parts by mass Subsequently, as illustrated in FIG. 2D, using an i-line stepper (wavelength 365 nm, manufactured by Canon Inc., trade name: i5), exposure was carried out through a first photomask 10 at an exposure amount of 3000 J/m$^2$, thereby proceeding dimerization reaction of the anthracene compound. As a result, a latent image pattern having a different photosensitive wavelength was formed on the exposed portions 203a of the second resin layer 203.

Subsequently, as illustrated in FIG. 2E, exposure was carried out using the unexposed portions 203b of the second resin layer 203 as a mask. The entire surface was exposed to light containing light having a wavelength of 280 nm or more at an exposure amount of 14 J/cm$^2$, using a Deep-UV exposure apparatus (manufactured by Ushio Inc., trade name; UX-3000).

Subsequently, as illustrated in FIG. 2F, removal of the second resin layer 203 and development of the first resin layer 202 were concurrently carried out using methyl isobutyl ketone, thereby forming a flow path pattern 209.

Subsequently, as illustrated in FIG. 2G, a photosensitive resin composition having the following composition was applied to the flow path pattern 209 and the substrate 201 with a thickness of 15 μm by spin coating, and prebaked at 90° C. for 2 minutes (hot plate), thereby forming a coating layer 210.

| | |
|---|---|
| EHPE (manufactured by Daicel Chemical Industries, Ltd.) | 100 parts by mass |
| SP-172 (manufactured by ADEKA Corporation) | 5 parts by mass |
| A-187 (manufactured by Dow Corning Toray Co., Ltd.) | 5 parts by mass |
| Methyl isobutyl ketone | 100 parts by mass |

Subsequently, as illustrated in FIG. 2H, using an i-line stepper (wavelength 365 nm, manufactured by Canon Inc., trade name: i5), the coating layer 210 was subjected to pattern exposure at an exposure amount of 4000 J/m², and then baked using a hot plate at 90° C. for 240 seconds.

Subsequently, as illustrated in FIG. 2I, the coating layer 210 was developed with methyl isobutyl ketone, rinsed with isopropyl alcohol, and subjected to heat treatment at 140° C. for 60 minutes, thereby forming discharge ports 212. In the exemplary embodiment, the diameter of the discharge ports 212 was 8 μm.

Subsequently, as illustrated in FIG. 2J, ink supply ports 214 were formed. Subsequently, as illustrated in FIG. 2K, the entire surface was exposed to light from the side of the flow path forming member at an exposure amount of 250000 m J/cm² using a Deep-UV exposure apparatus (manufactured by Ushio Inc., trade name: UX-3000), thereby solubilizing the flow path pattern 209. Thereafter, the flow path pattern 209 was dissolved and removed by immersing in methyl lactate under ultrasonic agitation, thereby forming flow paths 213.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2010-146903 filed Jun. 28, 2010, which is hereby incorporated by reference herein in its entirety.

What is claimed is:

1. A method for producing a structure comprising, in this order:
   providing a substrate composed of a first resin layer and a second resin layer laminated in this order, the first resin layer being made of a positive photosensitive resin having positive photosensitivity to light having a wavelength of 280 nm or more, and the second resin layer containing an anthracene compound;
   partially exposing the second resin layer to light having a wavelength of 300 nm or more and dimerizing the anthracene compound contained in exposed Portions of the second layer;
   radiating light having a wavelength of 280 nm or more to the first resin layer through the exposed portions of the second resin layer using the unexposed portions of the second resin layer as a mask, thereby exposing the first resin layer to light; and
   removing the exposed portions of the first resin layer to form a structure.

2. The method for producing a structure according to claim 1, wherein the anthracene compound has a structure represented by a formula (1):

[Chemical formula 1]

wherein $R^1$ to $R^8$ each independently represent hydrogen, an alkyl group, an alkoxy group, an alkenyl group, an ethynyl group, an aryl group, an acyl group having 1 to 20 carbon atoms, or a substituted organic group derived from any of the groups; $R^9$ and $R^{10}$ represent an alkoxy group having 1 to 20 carbon atoms, or an organic group substituted with other substituent.

3. The method for producing a structure according to claim 2, wherein the anthracene compound is 9,10-diethoxyanthracene.

4. The method for producing a structure according to claim 1, wherein the positive photosensitive resin is polymethyl isopropenyl ketone.

5. A method for producing a structure comprising, in this order:
   providing a substrate composed of a first resin layer and a second resin layer laminated in this order, the first resin layer being made of a negative photosensitive resin having negative photosensitivity to light having a wavelength of 280 nm or more, and the second resin layer containing an anthracene compound;
   partially exposing the second resin layer to light having a wavelength of 300 nm or more and dimerizing the anthracene compound contained in exposed Portions of the second layer;
   radiating light having a wavelength of 280 nm or more to the first resin layer through the exposed portions of the second resin layer using the unexposed portions of the second resin layer as a mask, thereby exposing the first resin layer to light; and
   removing the unexposed portions of the first resin layer to form a structure.

6. A method for producing a liquid discharge head including a flow path wall member having discharge ports for discharging a liquid and liquid walls communicated with the discharge ports, comprising:
   providing a substrate having a structure obtained by a method for producing a structure comprising, in this order:
      providing a substrate composed of a first resin layer and a second resin layer laminated in this order, the first resin layer being made of a positive photosensitive resin having positive photosensitivity to light having a wavelength of 280 nm or more, and the second resin layer containing an anthracene compound;
      partially exposing the second resin layer to light having a wavelength of 300 nm or more and dimerizing the anthracene compound contained in exposed portions of the second layer;

radiating light having a wavelength of 280 nm or more to the first resin layer through the exposed portions of the second resin layer using the unexposed portions of the second resin layer as a mask, thereby exposing the first resin layer to light; and
removing the exposed portions of the first resin layer to form a structure,
forming a coating layer to be the flow path wall member to coat the structure; and
removing the structure to form the flow paths.

* * * * *